United States Patent
Van Wijmeersch et al.

(10) Patent No.: US 9,042,065 B2
(45) Date of Patent: May 26, 2015

(54) HIGH HOLDING VOLTAGE, MIXED-VOLTAGE DOMAIN ELECTROSTATIC DISCHARGE CLAMP

(71) Applicant: Sofics BVBA, Gistel (BE)

(72) Inventors: Sven Van Wijmeersch, Gistel (BE); Benjamin Van Camp, Gistel (BE); Olivier Marichal, Gistel (BE); Johan Van der Borght, Gistel (BE)

(73) Assignee: Sofics BVBA, Gistel (BE)

( * ) Notice: Subject to any disclaimer, the term of this patent is extended or adjusted under 35 U.S.C. 154(b) by 54 days.

(21) Appl. No.: 13/708,356

(22) Filed: Dec. 7, 2012

(65) Prior Publication Data

US 2013/0163128 A1    Jun. 27, 2013

Related U.S. Application Data

(60) Provisional application No. 61/568,431, filed on Dec. 8, 2011.

(51) Int. Cl.
*H02H 3/22*    (2006.01)
*H01L 27/02*   (2006.01)
*H02H 9/04*    (2006.01)

(52) U.S. Cl.
CPC .......... *H01L 27/0262* (2013.01); *H02H 9/046* (2013.01)

(58) Field of Classification Search
USPC .................................................. 361/56, 111
See application file for complete search history.

(56) References Cited

U.S. PATENT DOCUMENTS

| | | | |
|---|---|---|---|
| 5,548,135 A | 8/1996 | Avery | |
| 5,600,525 A * | 2/1997 | Avery | 361/56 |
| 6,803,633 B2 * | 10/2004 | Mergens et al. | 257/358 |
| 8,704,308 B2 * | 4/2014 | Akai | 257/358 |
| 2002/0020880 A1 | 2/2002 | Yu | |
| 2003/0076636 A1 | 4/2003 | Ker et al. | |
| 2005/0087761 A1 | 4/2005 | Steinhoff | |
| 2005/0111150 A1 | 5/2005 | Jang et al. | |
| 2007/0069310 A1 | 3/2007 | Song et al. | |
| 2011/0304944 A1 * | 12/2011 | Salcedo et al. | 361/111 |

FOREIGN PATENT DOCUMENTS

WO    2011156233 A1    12/2011

\* cited by examiner

*Primary Examiner* — Danny Nguyen
(74) *Attorney, Agent, or Firm* — Volpe and Koenig, P.C.

(57) ABSTRACT

An electrostatic discharge (ESD) protection circuit is disclosed including at least a clamping device, a switching device, and a voltage limiter. The ESD protection circuit may include devices of different voltage domains. The switching device may be in series with the clamping device to block at least a portion of a voltage from dropping across the clamping device. The switching device may sustain higher maximum operating voltages than the clamping device.

24 Claims, 13 Drawing Sheets

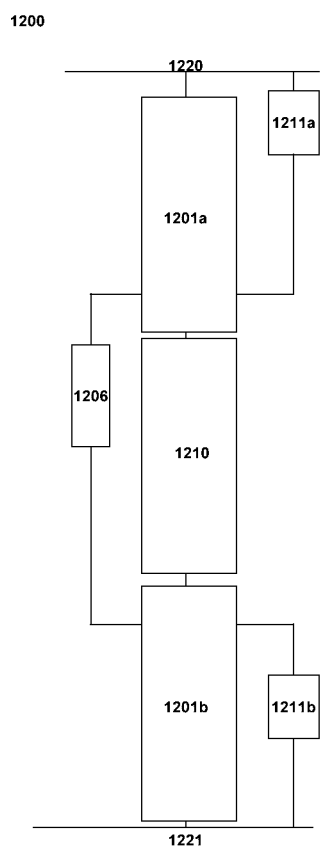
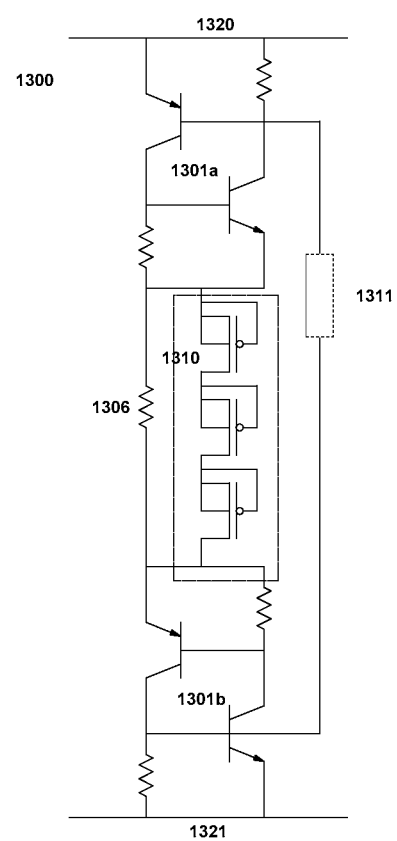
Figure 12
Figure 13

HIGH HOLDING VOLTAGE, MIXED-VOLTAGE DOMAIN ELECTROSTATIC DISCHARGE CLAMP

CROSS REFERENCE TO RELATED APPLICATIONS

This application claims the benefit of U.S. Provisional Application No. 61/568,431, filed Dec. 8, 2011, which is incorporated by reference as if fully set forth herein.

FIELD OF THE INVENTION

The invention generally relates to electrostatic discharge (ESD) protection, latch up (LU) prevention, and prevention of damage during electrical overstress (EOS) conditions. More specifically, the invention relates to a method of protecting an integrated circuit (IC) against ESD damages, while maintaining high levels of latch up robustness and EOS protection.

BACKGROUND OF THE INVENTION

During ESD, large currents can flow through an IC which can potentially cause damage. Damage can occur within the devices that conduct the current, as well as in devices that see a significant voltage drop due to the large current flow. To avoid damage due to an ESD event, clamps are added to the IC. These clamps may shunt the large ESD current without causing high voltage over sensitive nodes of the IC.

One concern with designing such ESD clamps is that they might shunt current during normal operating conditions, which may result in temporary loss of function, sometimes requiring human or other IC interaction to restore the normal operation. Further, if the clamps trigger in low conductive (shunt) mode during normal operation, the energy of the current through the clamp may be too high such that temporary or permanent damage can occur. An increased (supply) current during normal operation, often caused by faulty triggering of the ESD device, is called a latch up event, and might result in temporary loss of function, temporary damage, or permanent damage. EOS is most often caused by unwanted high voltages at IC pins.

A known way to overcome these issues is by creating ESD clamps with a high holding voltage. The holding voltage of the clamp is the lowest voltage at which the device can sustain its high conductive state. By increasing the holding voltage above the supply level, the ESD clamp is designed to release from latched state even if triggered during normal operation, such that the loss of function is at most temporary.

For some applications, such as automotive, a holding voltage may be much higher than the supply level, in order to avoid noise spikes causing temporary loss of function, or in order to allow off-chip ESD protection to shunt system-level ESD currents without triggering the on-chip ESD protection.

A further requirement for the ESD protection clamp may be to have a low standby or leakage current. For some applications, the amount of capacitance added to the pad must be minimized as well.

These concerns may be mostly problematic for high voltage ICs, wherein increasing the holding voltage typically comes at great silicon area cost. The creation of these ESD clamps for high voltage applications may typically take multiple silicon test runs to tune the ESD clamp device to have the desired holding and trigger voltage.

Yet another concern in high voltage technologies is the response time of the ESD clamp to an ESD event. The base transit times of bipolar devices in these technologies may be in the same order of magnitude or larger than the rise time of the ESD events. As such, the reaction of the clamp to an ESD event might be too late to effectively protect the IC.

No solution currently exists that combines the advantage of a tunable high holding voltage and appropriate trigger voltage within a reasonable silicon area, without the need for extensive process tuning or extensive, multiple test chip creation.

Therefore, there is a need in the industry for an improved ESD protection clamp, which combines the advantages of high and tunable holding voltage, low leakage, high and tunable trigger voltage, small silicon area for high current capability and fast and effective triggering without the need for multiple silicon runs to tune the important parameters of the clamp.

A holding voltage higher than the supply voltage may be desirable for ESD clamp devices to prevent latch up and false triggering due to events in the system. Such holding voltages can be reached by stacking a number of elements from a lower voltage domain in series. Since these elements are designed for a lower voltage domain, the stack might exhibit high leakage. In both cases, chip performance may be endangered by either oxide reliability or high leakage.

FIG. 1 shows a conventional ESD clamp. A gate-grounded N-type metal oxide semiconductor (ggNMOS) device is created, often using specific process adaptation techniques to achieve good ESD characteristics. Very often additional doping levels are needed specifically for ESD, increasing the cost of the process.

FIG. 2 shows another conventional ESD clamp. A high voltage (HV) silicon controller rectifier (SCR) is developed, wherein the ESD characteristics are tuned using layout and process techniques. The SCR may be triggered by some internal reverse junction breakdown.

SUMMARY OF THE INVENTION

An electrostatic discharge (ESD) protection circuit is disclosed having a high voltage (HV) switch over which the full or a large portion of the maximum pad voltage is placed, one or more low voltage (LV) protection clamps to tune the holding voltage and a voltage limiter circuit to limit the voltage over the LV protection clamps during normal operation. One or more trigger circuits can be added to provide a trigger signal to the HV switch and/or one or more of the LV protection clamps. The trigger circuits can be internal to the HV switch and/or LV protection clamps, or placed externally.

An embodiment of the electrostatic discharge (ESD) protection circuit for protecting circuitry coupled between a first node and a second node may comprise at least one clamping device of a first voltage domain coupled to the first node. The ESD protection circuit may further comprise a switching device of a second voltage domain coupled in series with the at least one clamping device and coupled to the second node. The ESD protection circuit may further comprise a voltage limiter coupled to the at least one clamping device and configured to limit a voltage over the at least one clamping device.

In some embodiments, a voltage level of the second voltage domain may be higher than a voltage level of the first voltage domain.

In some embodiments, a maximum voltage level corresponding to reliability and leakage requirements of the second voltage domain may be higher than a voltage level corresponding to reliability and leakage requirements of the first voltage domain.

In some embodiments, the at least one clamping device may include a plurality of serially-coupled clamping devices.

In some embodiments, the at least one clamping device may be a metal oxide semiconductor (MOS) device. The MOS device may be a low-voltage domain MOS device. The MOS device may also comprise a gate and a source, wherein the gate is connected to the source.

In some embodiments, a MOS device may comprise a gate, a drain, and a source. The clamping device may include at least one resistive voltage divider. The resistive voltage divider may include a first terminal having a first terminal voltage, a second terminal having a second terminal voltage, and a third terminal having a third terminal voltage. The second terminal voltage may be a divided voltage of a voltage difference between the third terminal voltage and the first terminal voltage. The gate of the MOS device may be coupled to the second terminal of the resistive voltage divider, the drain of the MOS device may be coupled to the first terminal of the resistive voltage divider, and the source of the MOS device may be coupled to the third terminal of the resistive voltage divider.

In some embodiments, the switching device may be a silicon controlled rectifier (SCR). The SCR may include an anode, a cathode, a first trigger tap, and a second trigger tap.

In some embodiments, the voltage limiter may be a resistor.

In some embodiments, the voltage limiter may be a MOS device.

In some embodiments, the ESD protection circuit may further include a triggering device coupled to the switching device. The triggering device may be configured to switch on the switching device during an ESD event.

In some embodiments, the triggering device may include at least one diode. The triggering device may include a plurality of diodes. The plurality of diodes may be serially-coupled together.

In some embodiments, the triggering device may further include a MOS device which includes a drain, a source, and a gate. The triggering device may further include a resistive element. A diode of the triggering device may be coupled between the drain of the MOS device and the gate of the MOS device. The resistive element may be coupled between the gate of the MOS device and the source of the MOS device.

In some embodiments, the cathode of the SCR may be coupled to an anode of the clamping device. The voltage limiter may be coupled between the cathode of the SCR and the first node to which the ESD protection device may be coupled. The voltage limiter may be coupled between the first trigger tap of the SCR and the first node. The anode of the SCR may be coupled to a cathode of the clamping device. The voltage limiter may be coupled between the anode of the SCR and the first node. The voltage limiter may be coupled between the second trigger tap of the SCR and the first node.

In some embodiments, the ESD protection circuit may include a first triggering device coupled between the first node and the first trigger tap of the SCR. The first triggering device may be configured to turn on the SCR during an ESD event. The ESD protection circuit may include a second triggering device coupled between the second trigger tap of the SCR and the second node. The second triggering device may be configured to turn on the SCR during an ESD event. The SCR may include both the first triggering device and the second triggering device.

In another embodiment, an ESD protection circuit, for protecting circuitry, may be coupled between a first node and a second node. The ESD protection circuit may include at least one clamping device with a maximum voltage rating below an operating voltage of the protected circuitry. The ESD protection device may further include a switching device and a voltage limiter. The voltage limiter may be configured to limit the voltage of the clamping device to a voltage below the maximum voltage rating. The switching device may be configured to block the voltage difference between the operating voltage and the voltage of the clamping device.

In some embodiments, the clamping device may include at least one MOS device. The switching device may include an SCR. The voltage limiter may include a resistor.

In some embodiments, the voltage limiter may be a resistor, a MOS device, or any combination thereof.

In some embodiments, the ESD protection circuit may also comprise a triggering device coupled to the switching device configured to switch on the switching device during an ESD event.

BRIEF DESCRIPTION OF THE DRAWINGS

A more detailed understanding may be had from the following description, given by way of example in conjunction with the accompanying drawings wherein:

FIG. 7a is a general schematic of another embodiment of a mixed voltage domain ESD clamp;

FIG. 7b is a circuit schematic of an exemplary implementation of the mixed voltage domain ESD clamp of FIG. 7a;

FIG. 8a is a general schematic of another embodiment of a mixed voltage domain ESD clamp;

FIG. 8b is a circuit schematic of an exemplary implementation of the mixed voltage domain ESD clamp of FIG. 8a;

FIG. 9a is a general schematic of another embodiment of a mixed voltage domain ESD clamp;

FIG. 9b is a circuit schematic of an exemplary implementation of the mixed voltage domain ESD clamp of FIG. 9a;

FIG. 12 is a general schematic of another embodiment of a mixed voltage domain ESD clamp;

FIG. 13 is a circuit schematic of an exemplary implementation of the mixed voltage domain ESD clamp of FIG. 12;

DETAILED DESCRIPTION OF THE INVENTION

Figure 1:
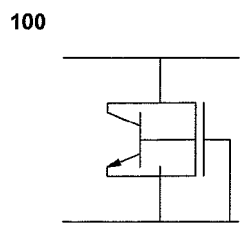
FIG. 1 is a circuit schematic of a conventional ggNMOS clamp.
Figure 2:
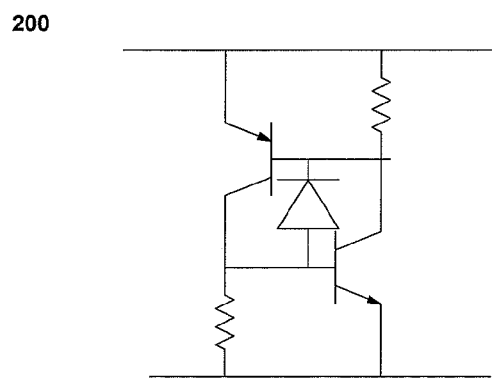
FIG. 2 is a circuit schematic of a conventional SCR clamp.
Figure 3:
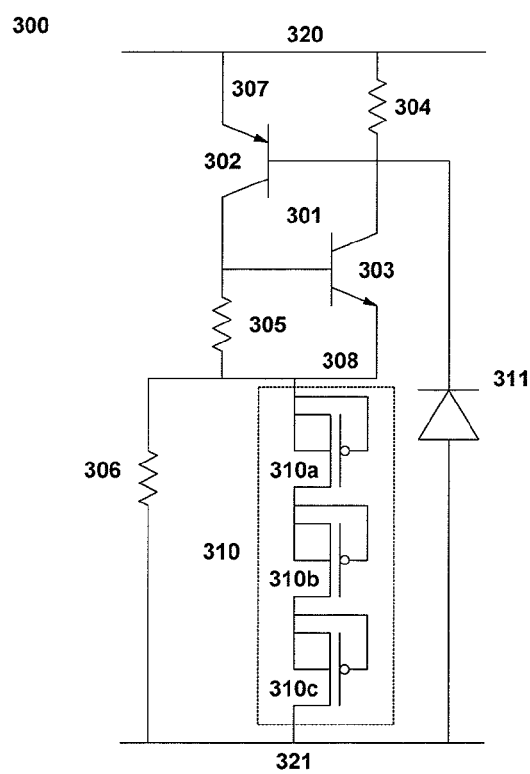
FIG. 3 is a circuit schematic of an embodiment of a mixed voltage domain ESD clamp.

In the following descriptions, common numerical designations may be used for similar, corresponding parts across multiple figures. In general, the part number will start with the figure number. For instance, voltage limiting device 306 as shown in FIG. 3 corresponds to similar voltage limiting device 506 shown in FIG. 5. Likewise, high voltage (HV) switch 701 shown in FIG. 7b corresponds to similar HV switch 1001 shown in FIG. 10.

Figure 19:
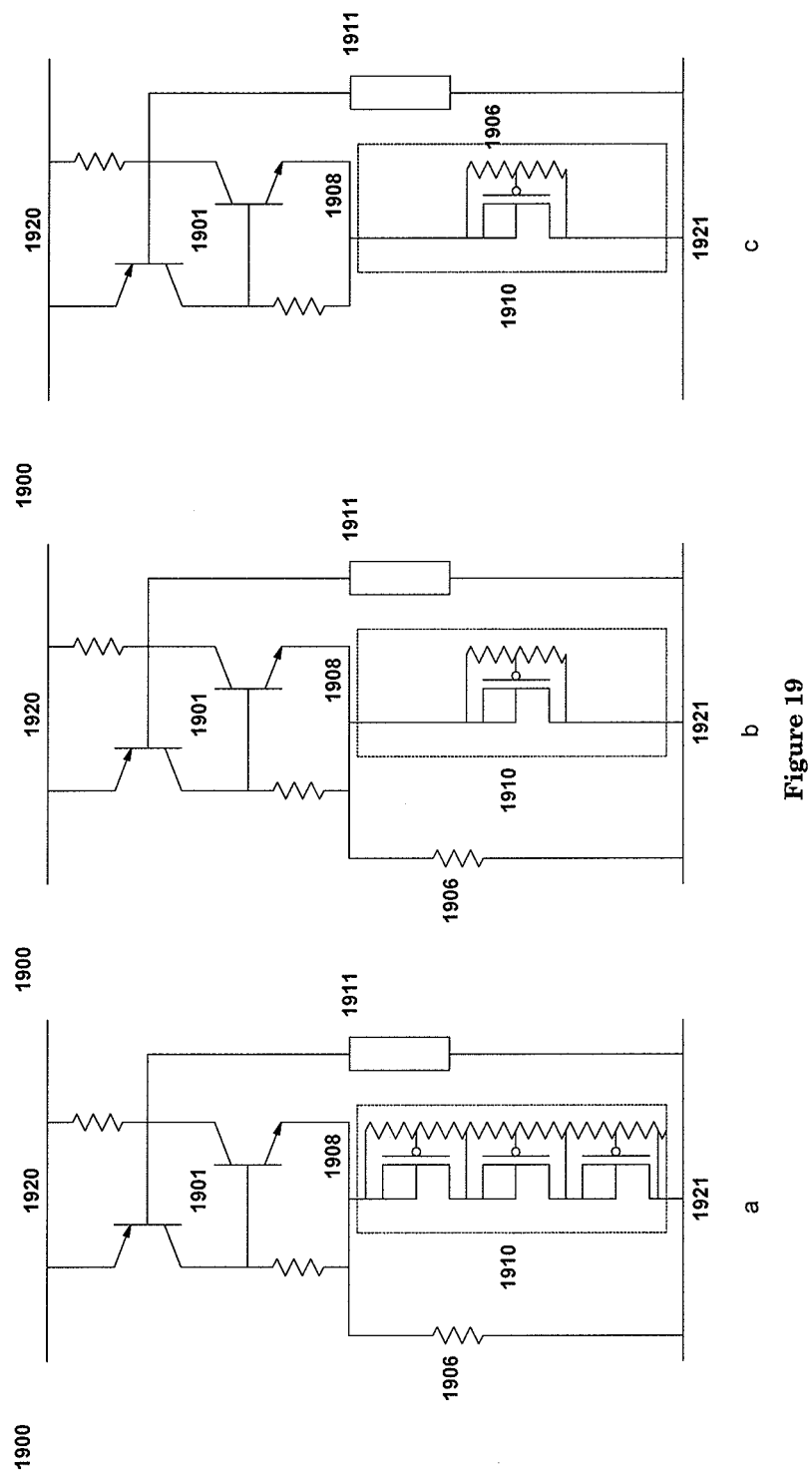
FIG. 19a is a circuit schematic of another embodiment of a mixed voltage domain ESD clamp.
FIG. 19b is a circuit schematic of another embodiment of a mixed voltage domain ESD clamp.
FIG. 19c is a circuit schematic of another embodiment of a mixed voltage domain ESD clamp.

One of ordinary skill in the art should recognize a node, device, circuit, or region may be viewed as serving multiple functions. Furthermore, a node, device, or region may be referred to by different descriptions. For instance, HV switch 301 of FIG. 3 may also be referred to as silicon controlled rectifier (SCR) 301. In this case, the SCR may be one possible implementation of a device operating as an HV switch. As another example, cathode 1921 and anode 1920 of FIG. 19 may also be referred to as node 1921 and node 1920, respectively. The numerical designation will provide an unambiguous notation for the node, device, circuit, or region under consideration while the preceding descriptor should aid the readability of the description in the context of the discussion.

FIG. 3 depicts a first embodiment of a mixed voltage domain electrostatic discharge (ESD) clamp. Circuit 300 may be a clamp in a high voltage (HV) domain between pads 320 and 321. Device 310 may be a stack of low voltage (LV) P-type metal oxide semiconductor (PMOS) devices (310a, 310b, and 310c) with gates connected to sources. The number of LV devices may be chosen so that the sum of the holding voltage of the device 310 and the HV switch 301 is above a specified voltage level (for example determined by the maximum voltage during normal operation, or in other words, a maximum operating voltage) to prevent latch-up during normal operation and so that the holding voltage is below the breakdown voltage of the circuitry to be protected. The holding voltage of the device 310 depicted in FIG. 3 is three times the holding voltage of a PMOS. Note that although device 310 is depicted as comprising three PMOS devices, device 310 may comprise fewer or more PMOS devices. Further, the device 310 may comprise other devices such as N-type metal oxide semiconductor (NMOS) devices, bipolar devices, etc. The specified level for the holding voltage may be related to the latch up immunity of the integrated circuit (IC), and may be determined by the usage of the IC in real world applications. This level may be slightly higher than the maximum pad voltage or slightly higher than the maximum supply level of the pad. The maximum supply level may be defined as the intended maximum voltage that can be placed over the device when the IC is operational, wherein the maximum pad voltage may be defined based on possible voltage peaks or disturbances that might reach the pad during operation.

The terms high voltage (HV) and low voltage (LV) may be used in opposition of each other for clarification purposes. The HV devices may sustain a higher absolute voltage as compared to the LV devices. In fact, HV may be used to denote that part of the circuitry that is designed to block (a large portion of) the maximum pad voltage without reliability issues (such as the HV switch), while LV may be used to denote the LV clamping device(s), that exhibit potential reliability and/or leakage issues if exposed to the maximum pad voltages. A maximum voltage rating may be associated with a device of a voltage domain such that the maximum voltage rating corresponds to the maximum voltage a device of the voltage domain may be exposed to without experiencing reliability or leakage issues. In other words, a device may meet reliability and leakage requirements for operating voltages up to the maximum voltage rating of the device, but may experience degradation in performance or degradation in device characteristics when operating beyond the maximum voltage rating. A device meeting reliability requirements may undergo acceptable or negligible changes in device characteristics during the lifetime of the device. For an HV device, the maximum voltage rating may be higher than the maximum voltage rating of an LV device. The LV devices can be defined for different LV supply voltages, e.g. 3.3V and 5V. The holding voltage of these elements may exceed their normal operating voltage by 50% or more. If multiple HV domains are available, the devices used can be a mixture of these domains. Note that the terms LV and HV are used from a reliability and/or leakage point of view; from a process point of view it is very well conceivable that the well types used for the HV switch would be the same as for the LV clamping devices.

The term LV clamping device(s) may be used for a device or stack of devices or another configuration of devices which may not be directly coupled between the two pads 320 and 321 because of leakage and/or reliability requirements. Note that the remaining voltage over the LV clamping devices when the maximum pad voltage is applied over the clamp may be design to be low enough to avoid reliability and leakage concerns.

The maximum voltage placed between the two pads 320 and 321 in non-ESD conditions may be called the maximum pad voltage in the remainder of this text.

The holding voltage of a device may be the lowest voltage that can be placed over the device, while the device is in triggered or high conduction mode.

The holding current may be the lowest current that can flow through a device when the device is in triggered or high conduction mode.

A resistive element may be any element over which a voltage is created when current flows through it: it can be implemented by any device that has a resistivity characteristic, such as a resistor, diode, transistor, etc. In some embodiments transistors may be used if a different resistance value is preferred during normal operation as opposed to during ESD, or if the high temperature behavior of the transistor is superior to that of the resistor.

A voltage limiter circuit may be a circuit that limits the voltage over the LV clamping device(s) below the critical level for reliability when the maximum pad voltage is placed over the clamp.

Referring to FIG. 3, a clamp may be placed between nodes 320 and 321. If LV clamping device 310 were placed directly between 320 and 321, the PMOS devices may be capable of protecting the system against ESD. However, this may also mean that each of the 3 PMOS devices, through voltage division, may see a voltage that is higher than the level defined by reliability concerns. This may cause issues with reliability, for instance oxide reliability. Moreover, as each PMOS may see a voltage drop larger than allowed by the process design rules, the leakage of the clamp might exceed desirable levels. For this embodiment, it is assumed that 3×LV supply voltage is much less than the HV supply voltage, such that the stack of 3 PMOS device 310*a*, 310*b*, and 310*c* may not be allowable due to reliability concerns.

Instead of merely placing LV clamping device 310 between node 320 and node 321, an SCR device 301 may be placed in series with LV clamping device 310. This SCR 301 may act as an HV switch between the HV supply 320 and the anode 308 of stack 310. The SCR 301 may be comprised of a PNP 302, which is coupled to node 320 through emitter 307, and an NPN 303, which is coupled to the anode 308 of stack 310. When the SCR device 301 is untriggered, in other words turned off, the voltage on node 308 may be pulled towards the supply ground 321 by virtue of resistive element 306 which may be in series and create a discharge path from 308 to 321. A small difference between the voltages on node 308 and 321 may be possible due to leakage current flowing through resistive elements 305 and/or 306. This may be the case even when the HV supply is on node 320. The full supply voltage may be over the internal reverse junction of the SCR (between collector and base of NPN 303). Resistive element 306 therefore may act as a voltage limiter for the LV clamping device(s).

During ESD, the voltage between nodes 320 and 321 may increase above the maximum pad voltage and above the breakdown voltage of the reverse diode 311 which in this case may be used as a trigger of the SCR 301. Provided with trigger current from the reverse breakdown of diode 311, the SCR 301 may trigger and allow the voltage at node 320 to be transferred to node 308 minus an offset voltage generated over the SCR 301. Device 310 can then sink the ESD current to node 321. When the ESD event is over and the voltage between node 320 and node 321 drops to a level that is lower than the combined holding voltage of stack 310 and SCR 301, both the SCR 301 and the stack 310 may turn off. The voltage at node 308 may swiftly drop to the voltage at node 321 as this node is discharged through resistive elements 305 and 306. Thus ESD protection is provided while reliability is ensured.

Note that in the embodiment of FIG. 3, the HV switch may be an SCR 301, created with PNP 302 and NPN 303, wherein the base of PNP 302 may be coupled to node 320 through resistive element 304 and the base of NPN 303 may be coupled to node 308 through resistive element 305.

Note that the devices may be dimensioned such that the LV clamping device(s) and the HV switch can conduct all or at least the majority of the ESD current. The trigger of the HV switch may only need to conduct current for a very short time (i.e. the time before the HV clamp triggers in high conduction mode), and can therefore be designed smaller. The voltage limiter circuit may typically only conduct a small current.

The trigger speed of the embodiment depicted in FIG. 3 may be faster than conventional ESD clamps. The base transit time of bipolar devices in many high voltage technologies may be large, which means that the ESD protection clamps using these bipolar devices (as is the standard approach) may be relatively slow compared to the rise time of ESD events (typically 100 ps to 10 ns). By using the LV clamping device(s) in the main ESD conduction path, the response time of the protection structure may be reduced, as the LV elements may typically have smaller base transit times due to higher doping levels and the reduced spacings. To leverage this advantage, the HV switch may be designed to be fast as well.

Using the LV protection elements for the high voltage protection allows for porting of the ESD clamp to multiple HV domains. Typically multiple high voltage domains in a process may have a common low voltage domain. By optimizing the LV clamping device(s) for the common low voltage domain, only the HV switch and trigger may be characterized in the high voltage domain. This may ease the complexity of the design of multiple clamps significantly.

The silicon area used for the embodiment depicted in FIG. 3 may be less than that of conventional ESD clamps. As the LV devices typically require smaller spacings compared to high voltage devices, the silicon area of the clamp may be smaller.

Different configurations of embodiments are possible. In more general terms an embodiment may comprise an HV switch, one or more LV devices which may be stacked, and a voltage limiter.

The HV switch may be able to sustain a large portion of the maximum pad voltage without reliability issues, such that the voltage over the LV clamping device(s) can remain below the critical level for reliability and/or leakage issues.

During ESD, the holding voltage of the LV clamping device(s) plus the holding voltage of the HV switch may be higher than the level required to avoid latch up, electrical overstress issues, and the negative effects of false triggering. The LV clamping device(s) may include one or more devices. When placed directly between nodes 320 and 321, they may exhibit reliability (and/or leakage) issues when the maximum pad voltage is placed between nodes 320 and 321.

During maximum pad voltage, the voltage limiter may limit the voltage over the LV clamping device(s) to a low enough value, to avoid reliability issues for the LV clamping device(s).

Figure 4:
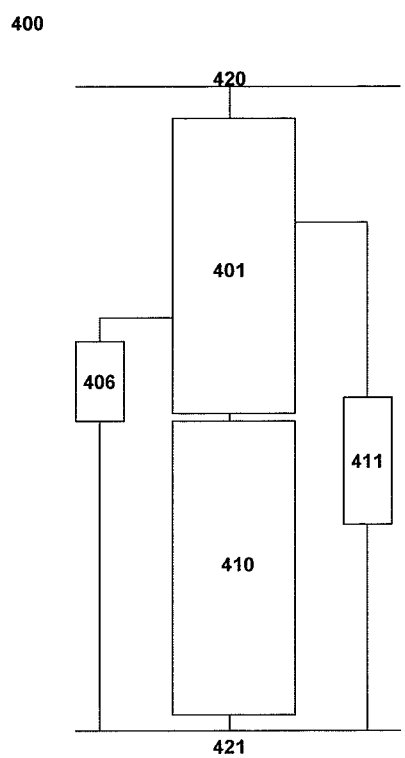
FIG. 4 is a general schematic of an embodiment of a mixed voltage domain ESD clamp.

FIG. 4 is a general schematic of one embodiment of a mixed voltage domain ESD clamp. Device 401 may be the HV switch. 406 may be the voltage limiter. Note that the voltage limiter 406 may be coupled to a node of the HV switch 401, such as the cathode of the HV switch. Device 411 may be a trigger circuit to trigger the HV switch 401 into conduction mode. Note that trigger circuit 411 can be omitted if the HV switch 401 is self-triggered at a trigger voltage below the critical level for ESD damage. Device 410 may be the LV clamping device(s), comprising one or more elements.

Figure 5:
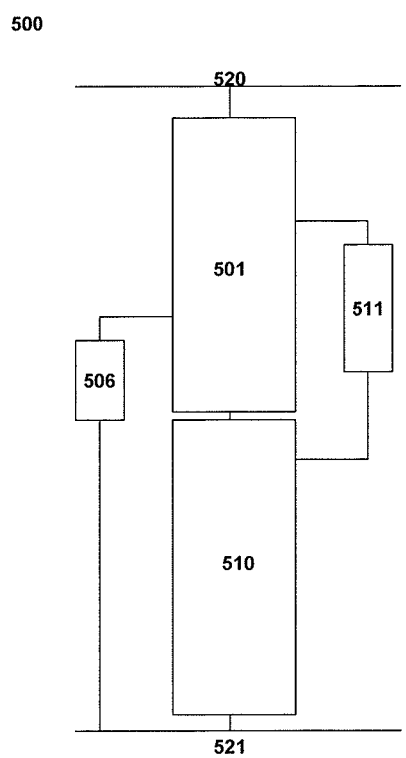
FIG. 5 is another general schematic of a mixed voltage domain ESD clamp.
Figure 6:
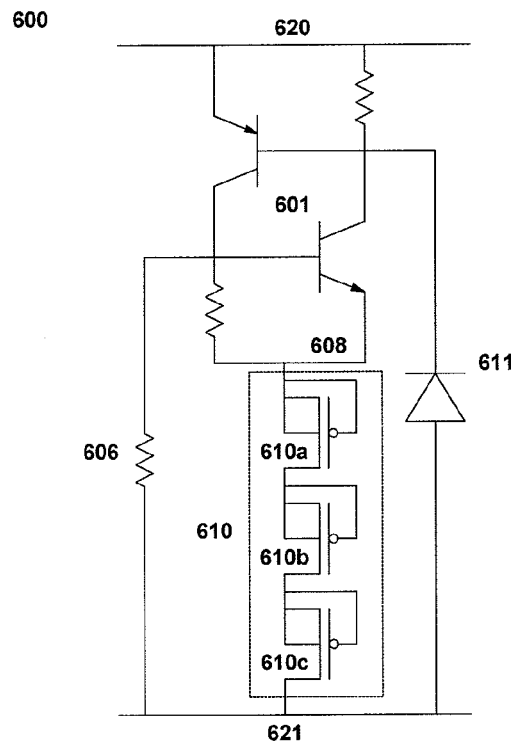
FIG. 6 is a circuit schematic of another embodiment of a mixed voltage domain ESD clamp.

The HV switch may be placed in series with the LV clamping device(s). If the HV switch requires an additional trigger circuit, such as trigger circuit 511 in FIG. 5, said trigger circuit 511 may be placed in series with at least part of the LV clamping device(s) 510, as shown in FIG. 5. The DC voltage limiter circuit may be placed in parallel with the LV clamping device(s), though in some embodiments, it may be placed in parallel with the LV clamping device(s) and one or more junctions of said HV switch, for example, as shown in FIG. 6. Note that although device 610 is depicted as comprising three PMOS devices, device 610 may comprise fewer or more PMOS devices. Further, the device 610 may comprise other devices such as NMOS devices, bipolar devices, etc.

Figure 7:
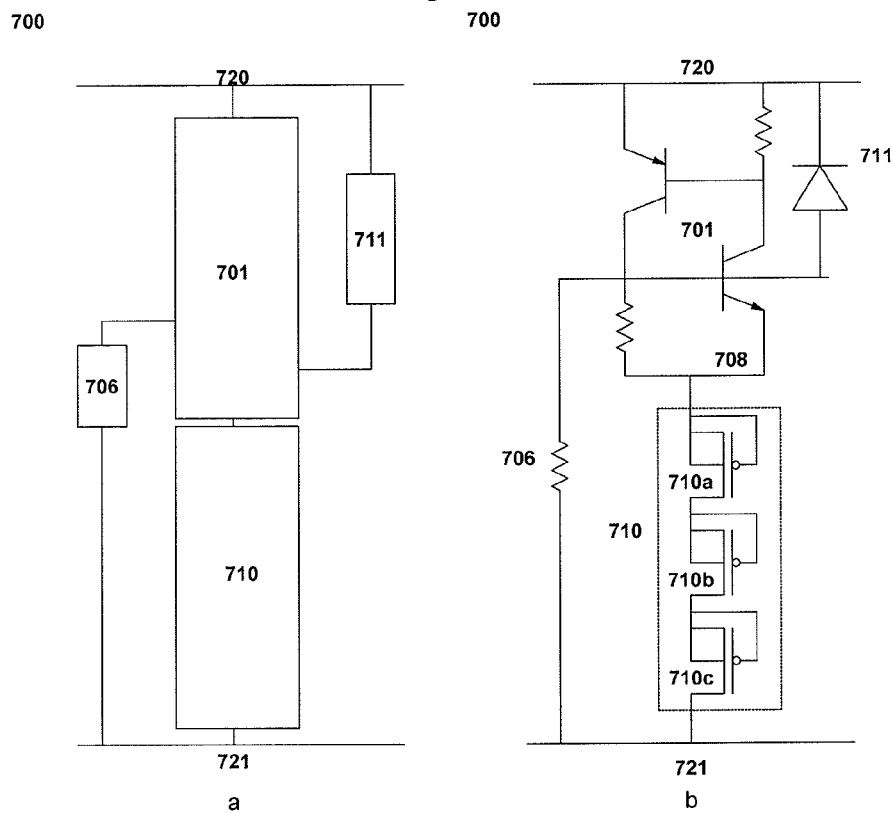

FIG. 7*a* illustrates an embodiment wherein the trigger circuit 711 may refer to node 720 instead of to node 721. FIG. 7*b* depicts one possible implementation of FIG. 7*a*. Note that though device 710 of FIG. 7*b* is depicted as comprising three PMOS devices, device 710 may comprise fewer or more PMOS devices. Further, the device 710 may comprise other devices such as NMOS devices, bipolar devices, etc.

Figure 8:
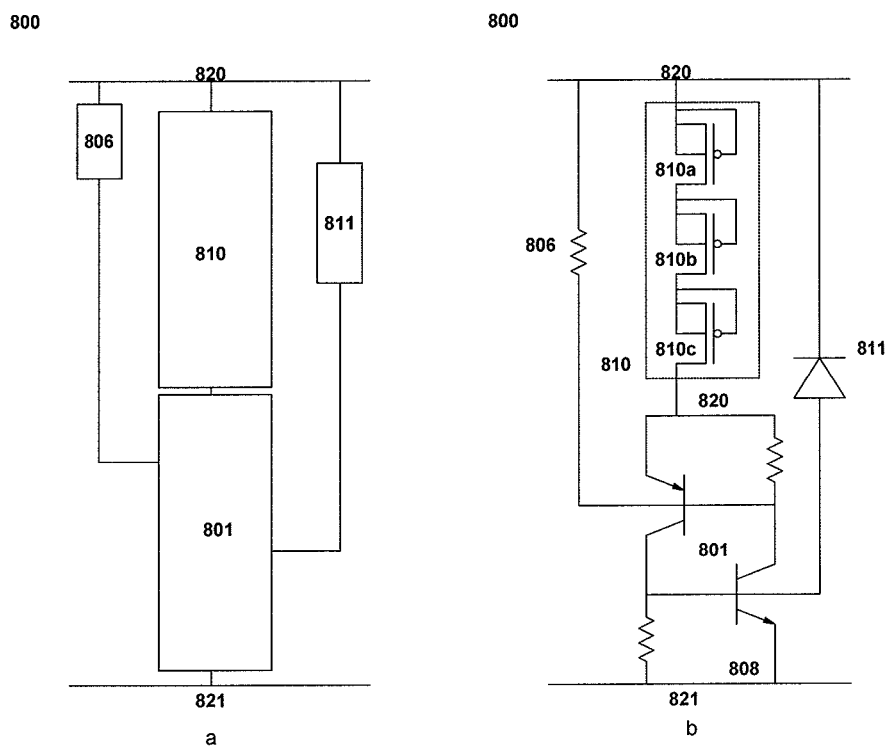

FIG. 8*a* depicts an embodiment wherein the LV clamping device(s) 810 may be coupled between node 820 and HV switch 801. The HV switch 801 may be coupled between the LV clamping device(s) 810 and node 821. Therefore, the voltage limiter circuit 806 may be coupled between node 820 and a node of HV switch 801. FIG. 8b depicts one possible implementation of FIG. 8a. Note that though device 810 of FIG. 8b is depicted as comprising three PMOS devices, device 810 may comprise fewer or more PMOS devices. Further, the device 810 may comprise other devices such as NMOS devices, bipolar devices, etc.

Figure 9:
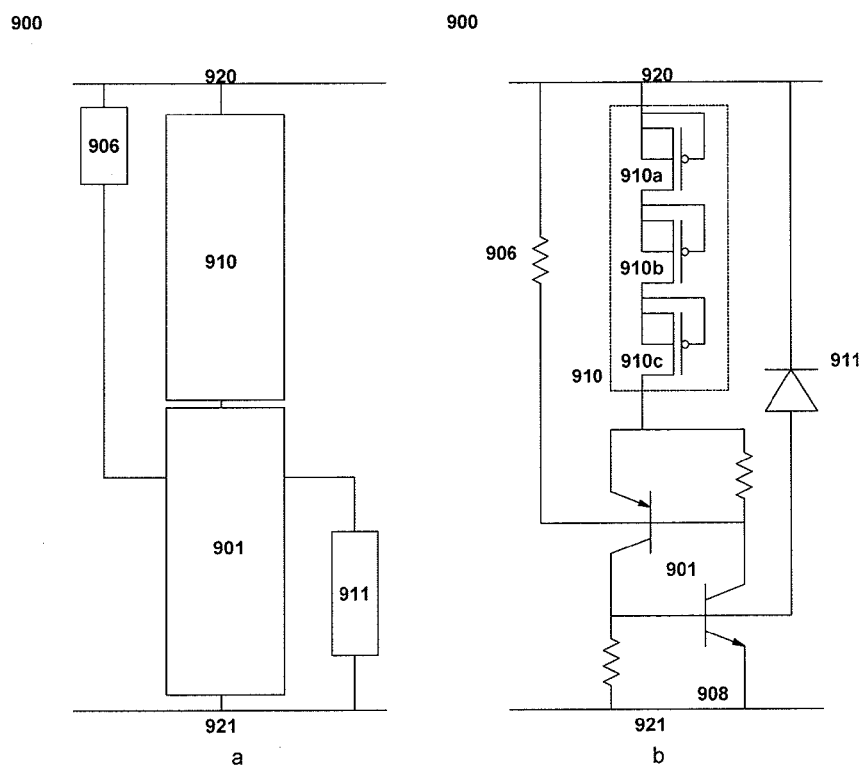

FIG. 9a is an embodiment wherein the trigger 911 may be coupled to the lower potential node 921 instead of node 920. FIG. 9b depicts one possible implementation of FIG. 9a. Note that though device 910 of FIG. 9b is depicted as comprising three PMOS devices, device 910 may comprise fewer or more PMOS devices. Further, the device 910 may comprise other devices such as NMOS devices, bipolar devices, etc.

Figure 10:
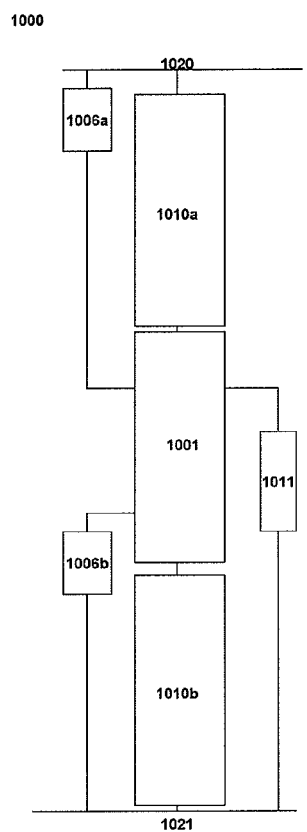
FIG. 10 is a general schematic of another embodiment of a mixed voltage domain ESD clamp.

The LV clamping device(s) can be spilt in multiple parts. FIG. 10 illustrates one possible embodiment of a mixed voltage domain ESD clamp wherein the LV clamping device(s) may be split into two parts: 1010a and 1010b. First LV clamping device 1010a may be placed between node 1020 and device 1001 and second LV clamping device 1010b may be placed between device 1001 and node 1021. The voltage limiter may also be split into a first voltage limiter 1006a and a second voltage limiter 1006b. In FIG. 10, trigger circuit 1011 may be coupled to node 1021, though it may be alternatively coupled to node 1020.

Figure 11:
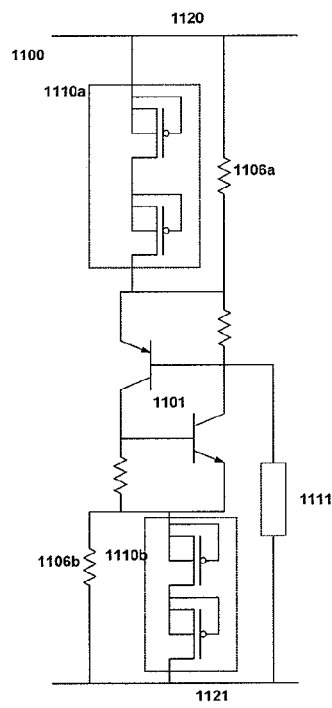
FIG. 11 is a circuit schematic of an exemplary implementation of the depicted embodiment of a mixed voltage domain ESD clamp in FIG. 10.

FIG. 11 shows an exemplary implementation of the embodiment depicted in FIG. 10. FIG. 11 depicts the LV clamping devices split in two stacks of 2 PMOS devices, a first LV clamping device 1110a and a second LV clamping device 1110b. One of skill in the art should recognize the LV clamping devices may comprise a different number of PMOS devices. The HV switch 1101 may be placed in between the first LV clamping device 1110a and the second LV clamping device 1110b. The LV clamping device(s) 1110a and 1110b may be protected by the voltage limiters 1106a and 1106b, respectively.

The HV switch can also be split into multiple parts. As an example, in FIG. 12 the HV switch may be split into two parts: 1201a and 1201b. FIG. 12 depicts trigger circuit 1211a coupled to node 1220 and trigger circuit 1211b coupled to 1221, though trigger circuit 1211a may be coupled to node 1221, and trigger circuit 1211b may be coupled to node 1220. Merging trigger circuit 1211a and trigger circuit 1211b into one circuit which may be coupled between HV switch 1201a and/or HV switch 1201b is possible as well: one node of the merged trigger 1211 may be coupled to HV switch 1201a and the other node of the merged trigger 1211 may be coupled to HV switch 1201b. As explained before, if the self triggering voltage of either HV switch 1201a or HV switch 1201b is within the specified range, trigger circuit 1211a and/or trigger circuit 1211b can be omitted. FIG. 12 depicts the voltage limiter 1206 coupled between HV switch 1201a and HV switch 1201b. Alternatively, voltage limiter 1206 may be split into a first voltage limiter 1206a (not in Figure) and a second voltage limiter 1206b (not in Figure), wherein the first voltage limiter 1206a may be coupled between HV switch 1201a and LV clamping device(s) 1210 and the second voltage limiter 1206b may be coupled between HV switch 1201b and LV clamping device(s) 1210. Alternatively, the first voltage limiter 1206a may be coupled to node 1221 and the second voltage limiter 1206b may be coupled to node 1220. Although in FIG. 12 the two HV switches 1201a and 1201b are separated by the LV clamping device(s) 1210 (thus the elements are placed in order 1201a-1210-1201b), any other configuration, for example wherein the order of devices is 1201a-1201b-1210 or 1210-1201a-1201b, is possible as well.

An exemplary implementation of the embodiment depicted in FIG. 12 is shown in FIG. 13. SCR 1301a and SCR 1301b may act as HV switches. Note that one reason for a split HV switch such as that shown in FIG. 13 may be that lower voltage wells are used, such that the breakdown voltage of a single SCR might be below the maximum pad voltage. A stack of LV PMOS devices 1310 may be used as LV clamping device(s), with a voltage limiter 1306 in parallel. Note that although FIG. 13 depicts the LV clamping device(s) 1310 comprising three LV PMOS devices, the LV clamping device(s) 1310 may comprise a different number of LV PMOS devices. A trigger 1311 may be connected to both SCR 1301a and SCR 1301b. As explained before, other trigger configurations, including self triggering of the SCRs through avalanching, may be possible.

Figure 14:
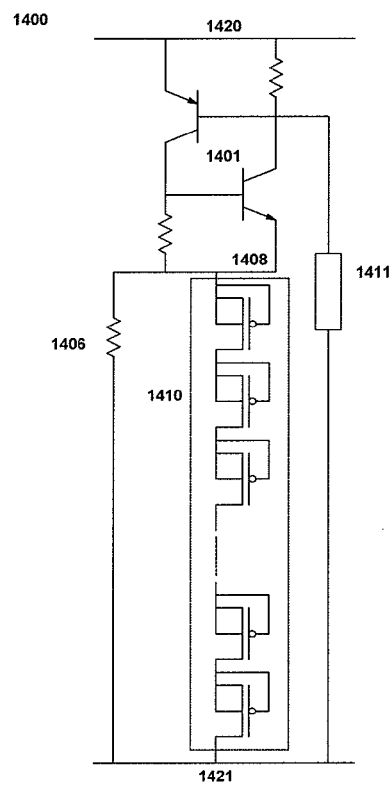
FIG. 14 is a circuit schematic of another embodiment of a mixed voltage domain ESD clamp.

In FIG. 14 the number of low voltage devices that are stacked to implement LV clamping device(s) 1410 may be varied. An embodiment may not be limited to any specific stack of devices. Holding voltage may be tuned by adjusting the number of stacked PMOS devices. Also, by changing the type of LV device in the stack from PMOS to NMOS, or by changing critical parameters of the LV devices such as the gate length, the holding voltage may be further tuned. These changes can be done on all of the LV elements in the stack 1410 or on one or more LV element in the stack 1410. Furthermore, the gate of a MOS device in the stack may be coupled to its drain or the gate of the MOS device may be coupled to the drain, source, or gate of another MOS in the stack. Alternatively, the gate of a MOS device may be coupled to node 1420, which may be the anode of the ESD clamp, or coupled to node 1421, which may be the cathode of the ESD clamp.

Figure 15:
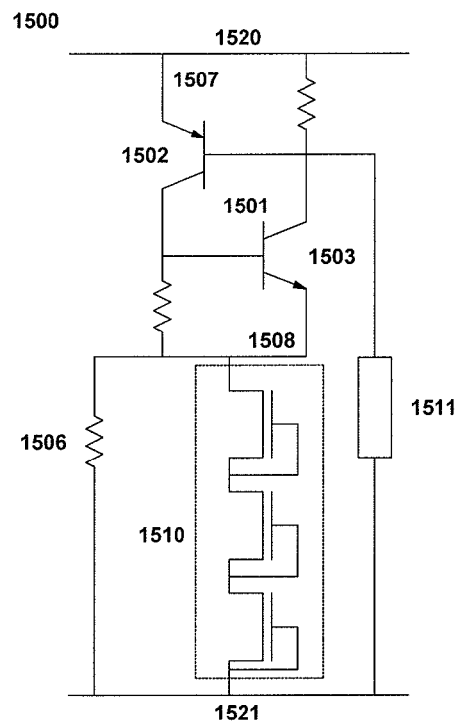
FIG. 15 is a circuit schematic of another embodiment of a mixed voltage domain ESD clamp.

FIG. 15 shows another embodiment wherein an NMOS device stack may be used in LV clamping device 1510. Although LV clamping device 1510 is depicted comprising three NMOS device, the number of NMOS devices can be changed.

The decision to use NMOS instead PMOS devices may depend on many process related issues. One such process influence may be the difference in holding and trigger voltage of the NMOS versus the PMOS. Due to higher electron mobility, NMOS devices tend to have a lower holding voltage than PMOS devices. Depending on the overall desired holding voltage level to be achieved by the clamp, either device or a combination of both might be preferable. The current conduction capability, on resistance and silicon area footprint of NMOS and PMOS may also influence the designed composition of the LV clamping device(s). Any combination of NMOS and/or PMOS devices is therefore possible. The total LV clamping device(s) can exhibit reliability issues when exposed to the maximum pad voltage, however, some of the elements of the LV clamping device(s) might not exhibit reliability issues while others may exhibit reliability issues when exposed to the same maximum pad voltage. For example, a MOS device of an LV clamping device may exhibit reliability issues and may degrade in performance when exposed to a maximum pad voltage. However, resistors may also be included in the LV clamping device which may survive the maximum pad voltage and may not suffer from degradation and, hence, may not exhibit reliability issues. It is possible to add other elements to fine tune the holding voltage. Indeed, the elements added in the LV clamping device(s) can be any combination of devices, such as MOS transistors, bipolar transistors, resistive elements or other impedance elements, capacitances, inductors, diodes, SCRs, etc.

Figure 16:
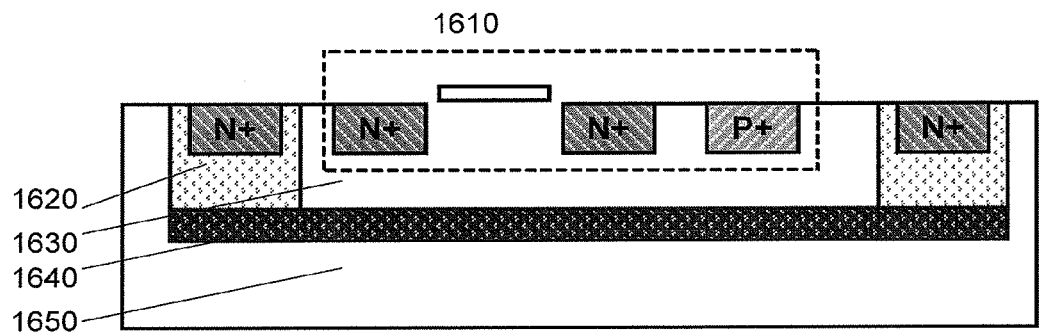
FIG. 16 is a diagram of a cross section of an NMOS device, which can be used in low voltage (LV) clamping devices.
Figure 17:
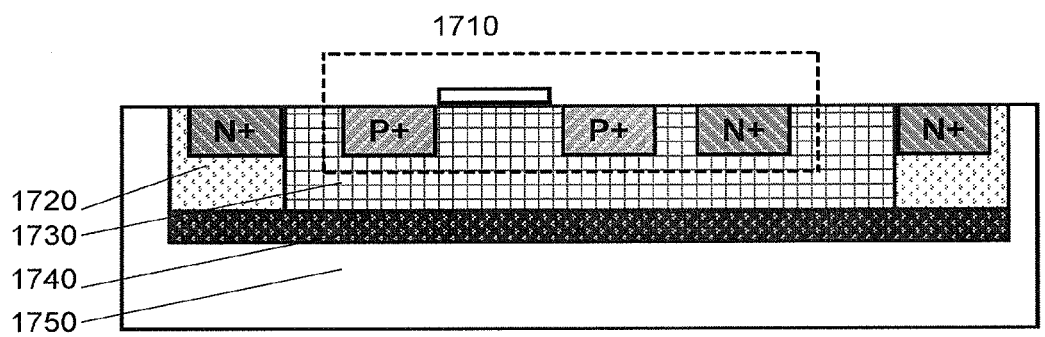
FIG. 17 is a diagram of a cross section of an PMOS device, which can be used in the LV clamping devices.
Figure 18:
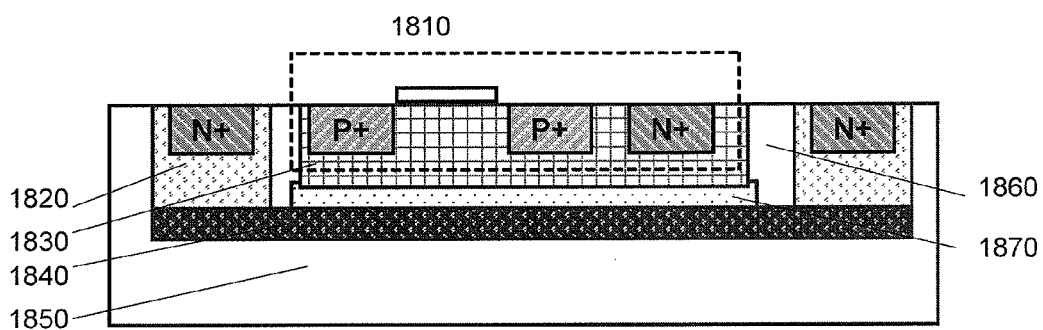
FIG. 18 is a diagram of a cross section of another PMOS device, which can be used in the LV clamping devices.

Note that because of the stacking, the upper elements in the stack can see a significant voltage to the lower pad 1521 during ESD. This might be an issue for devices with a low breakdown from their highest potential node directly to the substrate. For instance, if the voltage difference between a device and the lower pad 1521 is larger than the PMOS bulk (NWell) to substrate or PWell breakdown, this may result in an excessive current flow in both PMOS bulk and/or substrate. This, in turn, may result in triggering of parasitic bipolar devices, increased leakage, thermal breakdown in at least a portion of the NWell/PWell junction, or in thermal breakdown in the NWell or P-substrate pick up ties. Likewise, the drain/bulk junction of an NMOS used in the stack may see a voltage during ESD that is above its thermal breakdown voltage, or create a current flow in the substrate which may result in one of the above mentioned catastrophic events. In order to avoid these effects, the LV device may be surrounded by a different well, which may increase the breakdown voltage to the substrate. Examples of this are illustrated in FIG. 16, FIG. 17, and FIG. 18. In many cases, these additional wells may comprise HV wells. This isolation may also be beneficial for the reduction of noise effects during normal operation.

FIG. 16 shows an embodiment of an LV NMOS 1610 in an isolated PWell region 1630. The PWell may be isolated from the substrate 1650 through NWells 1620 and 1640. To increase the breakdown voltage of NWells 1620 and 1640 to the substrate 1650, high voltage NWells may be used. Additionally, by shielding the NMOS bulk 1630 from the substrate 1650, current may not flow through the substrate 1650, therefore greatly reducing the risk of triggering parasitic elements which may be formed by different devices in the substrate 1650.

Additionally the drain or source of LV NMOS 1610 may form an NPN with NWells 1620 and/or 1640, through PWell 1630. This NPN may contribute to the current capability of the entire clamping device.

For the connection of NWells 1620 and 1640 there are different options. NWells 1620 and 1640 can be coupled to the highest potential. In this case, an NPN may be formed comprising either NWell 1620 and/or 1640 as collector, PWell 1630 as base, and source of NMOS 1610 as emitter. This NPN may contribute significantly to the current flow. This conduction path may lower the total holding voltage of the ESD clamp. One may wish to compensate for the lower total holding voltage or this may be taken into account when this clamp is used. Increasing the resistivity of the conduction path may be one way to solve this issue. Alternatively, the NWells 1620 and 1640 may be coupled to the drain of NMOS 1610. In this case, the holding voltage of the described NPN may or may not be lower than the holding voltage of the NMOS 1610. It should be noted that in the latter case, NWells 1620 and 1640 may be coupled to ground through the voltage limiter circuit. As such, Nwells 1620 and 1640 may act as the emitter of a different parasitic NPN that also may have a collector formed from an N-type junction of a nearby circuit. The N-type junction may be coupled high. Alternatively, NWells 1620 and 1640 may act as the cathode of a parasitic SCR, wherein the SCR may further include a P-type junction in a nearby circuit acting as its anode. The connection and placement of Nwells 1620 and 1640 should be considered during design. An embodiment is not limited to any specific connection.

FIG. 17 shows an embodiment of an LV PMOS 1710. Around the bulk 1730 of the PMOS 1710, additional NWells 1720 and 1740 may be placed. The effect of this may be an increase in breakdown voltage from the PMOS bulk 1730 to the substrate 1750. A second effect may be the lowering of the beta of the parasitic PNP between the source of the PMOS and the substrate 1750, as the length of the base formed by NWells 1720, 1730, and 1740 may be larger than the base of the parasitic PNP of the LV PMOS 1720 by itself (i.e. without layers 1720 and 1740). This may result in a reduction in substrate current, and therefore a reduced risk of triggering a parasitic device.

FIG. 18 shows an embodiment of LV PMOS 1810, wherein P-type well 1870 and P-type well 1860 may be used to isolate PMOS bulk 1830 from the NWells 1820 and 1840. P-type well 1870 can be drawn explicitly in some technologies. In other technologies, P-type wells 1870 and 1860 may constitute the same well. This may be the case if the PMOS bulk 1830 is not deep enough to reach to layer 1820. FIG. 16, FIG. 17, and FIG. 18 illustrate different ways of isolating the low voltage transistors 1610, 1710, and 1810 from the substrate. Depending on the options available in the process, implementation of this principle may differ. It should be noted that embodiments are in no way limited to a specific configuration of this principle.

Some of the PMOS or NMOS devices in the LV clamping device(s) may be drawn in the same well. This is typically done to decrease the silicon area used, or to lower the holding voltage of the elements in series. If the elements are placed within the same well, such as in a merged layout style, the total holding voltage may be less than the sum of the holding voltages of the separate elements.

Figure 20:
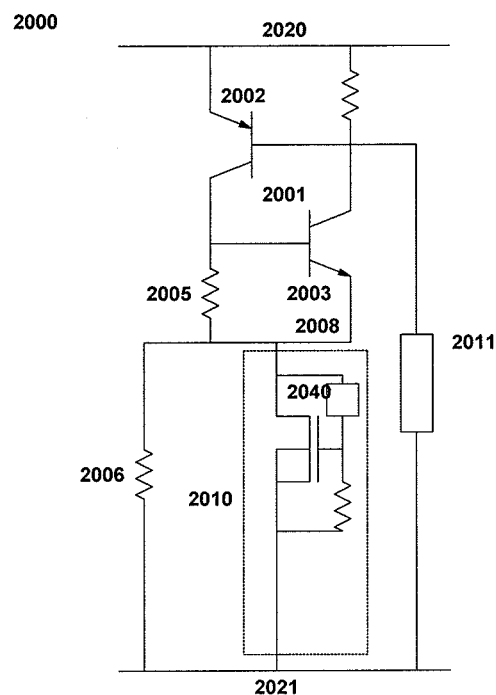
FIG. 20 is a circuit schematic of another embodiment of a mixed voltage domain ESD clamp.

HV switch 1901 depicted in FIG. 19*a* may block leakage current. As such, ESD protection with higher leakage in the LV clamping device(s) 1910 can be used. FIG. 19*a* depicts resistive elements that can be used as voltage dividers at the gates of the MOS devices in the stack, for instance, as a means to reduce trigger voltage. By way of example, as shown in FIG. 19*b*, only one MOS may be used as the LV clamping device. This MOS may be a LV or an HV MOS device. Since the MOS may have high leakage due to the gate bias, it may not be used directly between anode 1920 and cathode 1921. FIG. 19*c* shows an implementation wherein the voltage limiter circuit 1906 is used as a voltage divider. The voltage limiter circuit 1906 may now have 2 functions: to limit the voltage over the low voltage clamping device 1910 and provide a divided voltage to the MOS 1910. Other techniques can be used as well. For example, as shown in FIG. 20, a gate biasing circuit 2040 may be used with an NMOS device. The gate biasing circuit 2040 may include capacitors, resistors, forward or reverse diodes, etc.

Different methodologies can be used to engineer the holding voltage and trigger voltage, failing current, or any other parameter of each individual element of the LV clamping device(s), or to engineer the trigger voltage and holding voltage, failing current, or any other parameter of multiple LV clamping device(s). Some approaches may include applying biasing signals to the bulk or gate of the transistors, bulk pumping techniques, substrate resistance engineering, applying ballasting, multi-finger triggering techniques, merging of different transistors in a cascode, etc. Note that these techniques can have different purposes: lower/increase the trigger voltage of one or more elements of the LV clamping device(s), lower/increase the holding voltage of one or more elements of the LV clamping device(s), increase the current capabilities of one or more elements of the LV clamping device(s), increase/decrease the ON resistance of one or more elements of the LV clamping device(s), etc.

Figure 21:
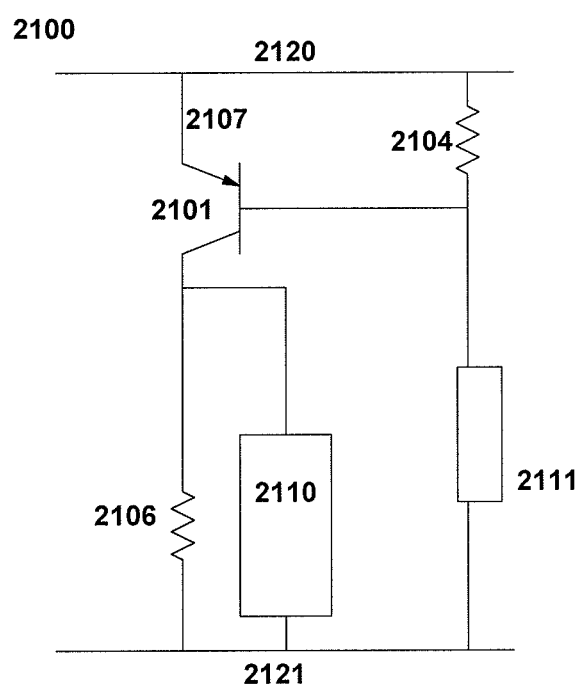
FIG. 21 is a circuit schematic of another embodiment of a mixed voltage domain ESD clamp.

Different implementations of the HV switch are possible. An SCR (for instance SCR 301 as shown in FIG. 3), a bipolar (for instance bipolar 2101 as shown in FIG. 21), or other devices may be used. Such devices may shunt high currents during ESD and may block at least a significant portion of the maximum pad voltage, such that a LV clamping device(s) can be designed to tune the holding (and trigger) voltage along with a voltage limiter circuit to maintain high reliability for the LV clamping device(s). Characteristics of a device or circuit acting as the HV switch may include: a holding voltage within specified range, the ability to switch from a high or very high impedance state to a low or very low impedance state, and the ability to switch from one state to the other by providing some minimal trigger current and fast triggering speed. The minimum holding voltage of the HV switch may have a value such that the sum of the holding voltage of the HV switch and the holding voltage(s) of the LV clamping device(s) is larger than the supply voltage. A high holding current HV switch may also ease the design of the voltage limiter circuit and/or the low voltage stack.

FIG. 21 illustrates an embodiment including an HV switch implemented as a PNP bipolar 2101, wherein the trigger circuit 2111 may draw current through resistive element 2104. If the emitter-base junction 2017 of bipolar 2101 is sufficiently forward biased due to the voltage drop over resistive element 2104, bipolar 2101 may shunt current through the voltage limiter circuit 2106 and the LV clamping device(s) 2110.

Figure 22:
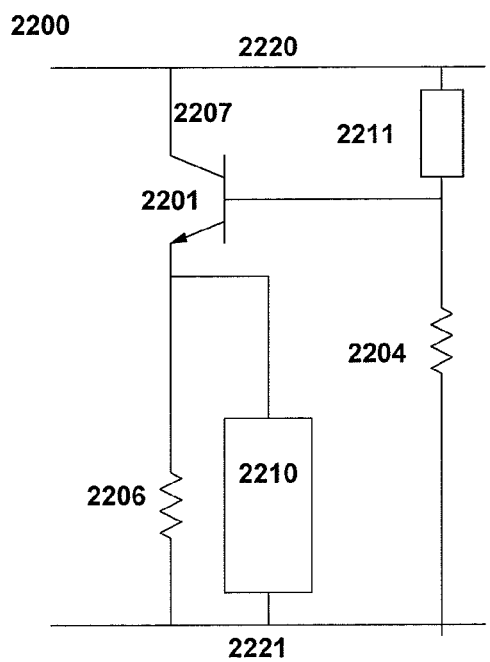
FIG. 22 is a circuit schematic of another embodiment of a mixed voltage domain ESD clamp.

FIG. 22 illustrates an embodiment with an HV switch implemented as an NPN bipolar 2201, wherein the trigger circuit 2211 may draw current through resistive element 2204. If the emitter-base junction of NPN 2201 is sufficiently forward biased due to the voltage drop over resistive element 2204, bipolar 2202 may shunt current through voltage limiter circuit 2206 and the LV clamping device(s) 2210.

In some embodiments, an HV switch may be designed with a high holding voltage. The overall holding voltage may be a function of the holding voltage of the HV switch plus the holding voltage of the LV clamping devices. By designing the HV switch such that its holding voltage may be closer to the desired overall holding voltage, the LV clamping device holding voltage may be reduced. Reducing the holding voltage of the LV clamping device may allow the LV clamping device to be formed in a smaller area.

The trigger circuit of the HV switch can be external to the HV switch or the HV switch can be self-triggering. No limitation on trigger circuit, trigger circuit connectivity, trigger circuit layout, triggering mechanism, such as voltage, current, RC timing based or a combination of these, is required. Any variation can be implemented into any embodiment. Examples of trigger circuits include Zener or any other type of diodes in forward or reverse, any type of transistors with or without additional gate/bulk biasing circuits, capacitors, RC timing based circuits, inductors, and any combination thereof.

In most Figures, the voltage limiter circuit is shown as a resistive element. Other implementations are possible as well. If a resistive element is used, the resistance value may be high enough such that the sum of the voltage drop over the resistive element when the holding current of the HV switch flows through said resistive element and the holding voltage of the HV switch may be at least equal to the desired holding voltage for the total ESD clamp. Therefore, a high holding current of the HV switch may allow for a lower resistance of the resistive element. However, the resistance value of the resistive element may be low enough such that the voltage drop during transients during normal operation may be below the critical level for reliability of the LV clamping devices in the time-frame relevant for the transients.

Figure 23:
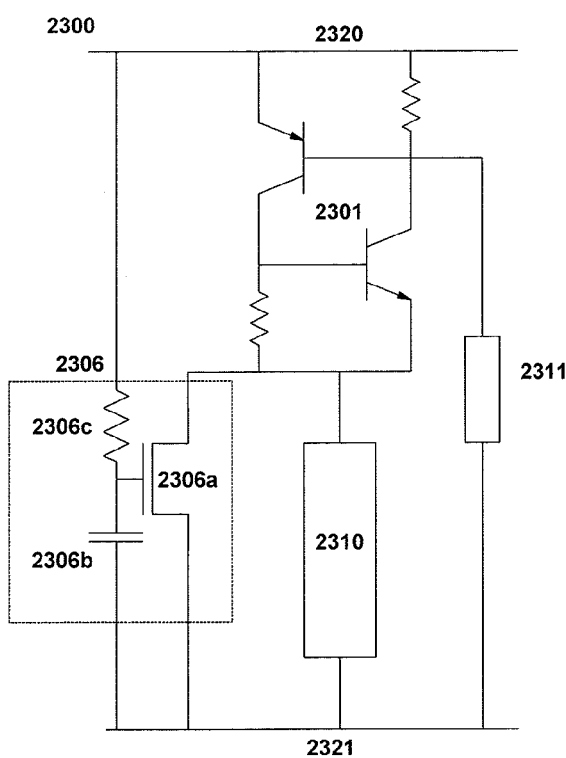
FIG. 23 is a circuit schematic of another embodiment of a mixed voltage domain ESD clamp.

As shown in FIG. 23, the voltage limiter circuit 2306 may be implemented as an NMOS 2306a, with RC gate biasing circuit, comprising capacitor 2306b and resistive element 2306c. In this case, the RC circuit may be designed to lower the resistance value of transistor 2306a during normal operation by applying a gate bias. As such, the voltage drop over the LV clamping device(s) 2310 during normal operation may be minimized. During ESD or during a significant noise event, the voltage limiter circuit 2306 may be much higher in impedance, such that if the HV switch 2301 would operate in a low conductivity mode, the voltage drop over the voltage limiter circuit 2306 may be above the holding voltage of the low voltage stack thus avoiding latch up. The implementation is not limited to this specific circuit. Every circuit that limits the voltage during normal operation below the critical level for reliability can be used as a limiter circuit.

Figure 24:
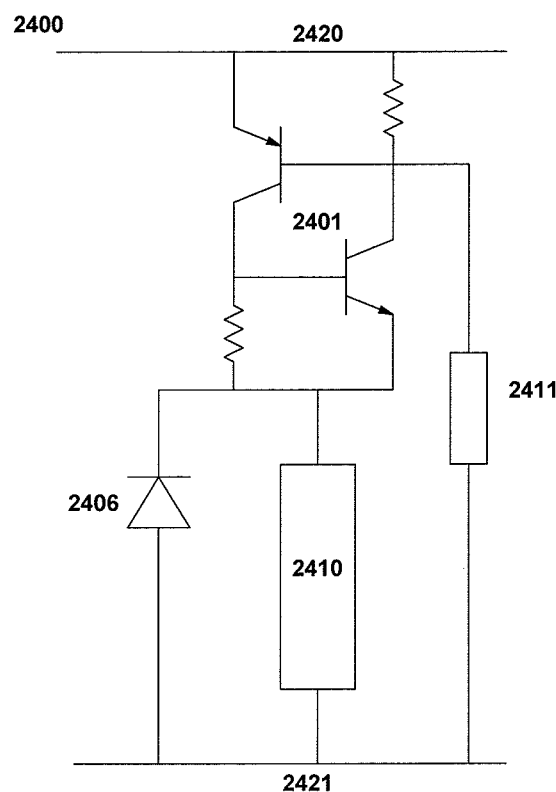
FIG. 24 is a circuit schematic of another embodiment of a mixed voltage domain ESD clamp.

As shown in the embodiment depicted in FIG. 24, the voltage limiter circuit 2406 is implemented by a reverse diode. This diode may be a Zener diode. Indeed, assuming the breakdown voltage of the diode is below the voltage beyond which the LV clamping device(s) 2410 exhibit reliability issues, the reverse diode can effectively limit the voltage over the LV clamping device(s) 2410.

Any device(s) or circuits that clamp the voltage over the LV clamping device(s) to a safe level when the maximum pad voltage is applied over the clamp can be considered a voltage limiter circuit. Many elements can be used as voltage limiter circuits, such as PN junction diodes, Zener diodes, SCRs, MOS transistors, bipolar transistors or other transistor types, inductors, capacitors, etc.

The leakage of the low voltage stack and limiter circuit should be lower than the holding current of the high voltage HV switch, as otherwise said leakage current may keep the HV switch in latched mode after false triggering. Therefore, by increasing the holding current of the high voltage HV switch, the leakage current of the LV clamping device(s) and limiter circuit may be higher, easing their design.

It should be noted that in many applications, wherein the invention is used for core protection, the voltage limiter circuit may be designed to reduce the voltage over the LV clamping device(s) when the maximum pad voltage is applied. In some applications, more complicated calculations may be needed such that the voltage is also limited during AC or voltage swing conditions. In some cases, the voltage limiter circuit can be omitted, without risking the reliability of the LV stack. This may be the case if the HV switch blocks sufficient voltage without the voltage limiter circuit present, if a voltage limiter circuit is present as a parasitic device such as substrate resistance, or if the capacitive distribution of the voltage is such that the voltage over the LV clamping devices is below the critical level for reliability when the maximum pad voltage is applied. Even in these cases, a voltage limiter circuit may be added to ensure the voltage level over the LV clamping device(s) is below the critical level for reliability in all conditions and at all times.

Figure 25:
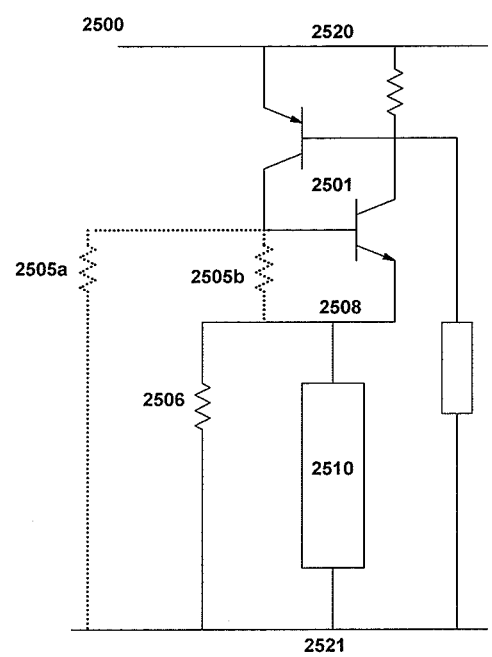
FIG. 25 is a circuit schematic of another embodiment of a mixed voltage domain ESD clamp.

In the embodiment depicted in FIG. 3, the voltage limiter circuit 306 may be coupled to the cathode of the SCR 301, however variations are possible. For instance, FIG. 20 depicts coupling of the voltage limiter to the G1 tap of the SCR (the collector of PNP 2002 or the base of NPN 2003) through resistor 2005. As another example, in FIG. 25 it is shown that a resistive connection between the G1 tap and ground may exist through substrate resistance 2505a, even though none is drawn in the layout. This may be the case when the SCR 2501 is placed in the substrate, which may function as ground as well. Resistive element 2505a and/or 2505b can be added or omitted as explained before.

Figure 26:
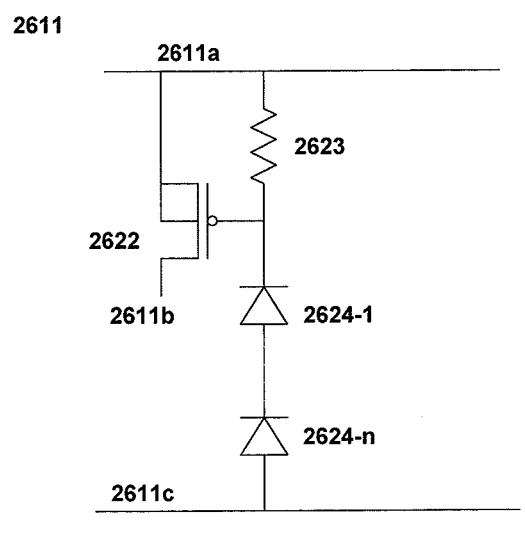
FIG. 26 is a circuit schematic of an exemplary trigger circuit.

Although in most examples a Zener diode is used as a trigger device, other trigger devices are also possible. FIG. 26 shows an example of an alternative trigger 2611. The trigger 2611 comprises a PMOS 2622, a resistive element 2623 and n diodes 2624-1 to 2624-*n*. The n diodes 2624 could be of the same type or some could be of different types. Node 2611*c* could be coupled to node 2611*b* or alternatively to the cathode 2621.

What is claimed is:

1. An electrostatic discharge (ESD) protection circuit configured to operate in a normal operation mode and an ESD operation mode, for protecting circuitry coupled between a first node and a second node, the ESD protection circuit comprising:
   at least one clamping device coupled to the first node, wherein each of the at least one clamping device is a low voltage device, wherein each of the at least one clamping device has a first maximum voltage rating during the normal operation mode, and wherein each of the at least one clamping device is configured to trigger during the ESD mode and is configured to be off during the normal operation mode;
   a switching device coupled in series with the at least one clamping device and coupled to the second node, wherein the switching device is a high voltage device, wherein the switching device has a second maximum voltage rating during the normal operation mode that is higher than the first maximum voltage rating during the normal operation mode, and wherein the switching device is configured to trigger during the ESD mode and is configured to be off during the normal operation mode; and
   a voltage limiter coupled to the at least one clamping device and configured to limit a voltage over the at least one clamping device during the normal operation mode.

2. The ESD protection circuit of claim 1, wherein the low voltage device is formed by a first process design rule defining the first maximum voltage rating and wherein the high voltage device is formed by a second process design rule defining the second maximum voltage rating.

3. The ESD protection circuit of claim 1, wherein a maximum voltage level corresponding to reliability requirements of the switching device is higher than a maximum voltage level corresponding to reliability requirements of the at least one clamping device.

4. The ESD protection circuit of claim 1, wherein the at least one clamping device includes a plurality of serially-coupled clamping devices.

5. The ESD protection circuit of claim 1, wherein the at least one clamping device includes at least one metal oxide semiconductor (MOS) device.

6. The ESD protection circuit of claim 5, wherein the at least one MOS device is at least one low-voltage domain MOS device.

7. The ESD protection circuit of claim 5, wherein each MOS device of the at least one MOS device comprises a gate and a source, and wherein the gate of each MOS device is connected to the respective source thereof.

8. The ESD protection circuit of claim 5, wherein a MOS device of the at least one MOS device comprises a gate, a drain, and a source, and
   further wherein the at least one clamping device includes at least one resistive voltage divider, the at least one resistive voltage divider including:
      a first terminal having a first terminal voltage;
      a second terminal having a second terminal voltage; and
      a third terminal having a third terminal voltage;
      wherein the second terminal voltage is a divided voltage of a voltage difference between the third terminal voltage and the first terminal voltage; and
   wherein the gate of the MOS device is coupled to the second terminal of the at least one resistive voltage divider, the drain of the MOS device is coupled to the first terminal of the at least one resistive voltage divider, and the source of the MOS device is coupled to the third terminal of the at least one resistive voltage divider.

9. The ESD protection circuit of claim 1, wherein the switching device is a silicon controlled rectifier (SCR).

10. The ESD protection circuit of claim 1, wherein the voltage limiter is a resistor.

11. The ESD protection circuit of claim 1, wherein the voltage limiter is a metal oxide semiconductor (MOS) device.

12. The ESD protection circuit of claim 1, further comprising a triggering device coupled to the switching device, the triggering device configured to switch on the switching device during the ESD mode.

13. The ESD protection circuit of claim 12, wherein the triggering device comprises at least one diode.

14. The ESD protection circuit of claim 13, wherein the triggering device further comprises:
   a MOS device including a drain, a source, and a gate; and
   a resistive element;
   wherein the at least one diode is coupled between the drain of the MOS device and the gate of the MOS device, and further wherein the resistive element is coupled between the gate of the MOS device and the source of the MOS device.

15. The ESD protection circuit of claim 9, wherein the SCR includes:
   an anode, a cathode, a first trigger tap, and a second trigger tap;
   wherein the cathode of the SCR is coupled to an anode of the clamping device; and
   further wherein the voltage limiter is coupled between the cathode of the SCR and the first node.

16. The ESD protection circuit of claim 9, wherein the SCR includes:
   an anode, a cathode, a first trigger tap, and a second trigger tap;
   wherein the cathode of the SCR is coupled to an anode of the clamping device; and
   further wherein the voltage limiter is coupled between the first trigger tap of the SCR and the first node.

17. The ESD protection circuit of claim 9, wherein the SCR includes:
   an anode, a cathode, a first trigger tap, and a second trigger tap;
   wherein the anode of the SCR is coupled to a cathode of the clamping device; and
   further wherein the voltage limiter is coupled between the anode of the SCR and the first node.

18. The ESD protection circuit of claim 9, wherein the SCR includes:
   an anode, a cathode, a first trigger tap, and a second trigger tap;
   wherein the anode of the SCR is coupled to a cathode of the clamping device; and
   further wherein the voltage limiter is coupled between the second trigger tap of the SCR and the first node.

19. The ESD protection circuit of claim 15, further comprising at least one of:
   a first triggering device coupled between the first node and the first trigger tap of the SCR, the first triggering device configured to turn on the SCR during the ESD mode; and a second triggering device coupled between the second trigger tap of the SCR and the second node, the second triggering device configured to turn on the SCR during the ESD mode.

20. The ESD protection circuit of claim 16, further comprising at least one of:
   a first triggering device coupled between the first node and the first trigger tap of the SCR, the first triggering device configured to turn on the SCR during the ESD mode; and
   a second triggering device coupled between the second trigger tap of the SCR and the second node, the second triggering device configured to turn on the SCR during the ESD mode.

21. The ESD protection circuit of claim 17, further comprising at least one of:
   a first triggering device coupled between the first node and the first trigger tap of the SCR, the first triggering device configured to turn on the SCR during the ESD mode; and
   a second triggering device coupled between the second trigger tap of the SCR and the second node, the second triggering device configured to turn on the SCR during the ESD mode.

22. The ESD protection circuit of claim 18, further comprising at least one of:
   a first triggering device coupled between the first node and the first trigger tap of the SCR, the first triggering device configured to turn on the SCR during the ESD mode; and
   a second triggering device coupled between the second trigger tap of the SCR and the second node, the second triggering device configured to turn on the SCR during the ESD mode.

23. An electrostatic discharge (ESD) protection circuit configured to operate in a normal operation mode and an ESD operation mode, for protecting circuitry coupled between a first node and a second node, the ESD protection circuit comprising:
   at least one clamping device having a maximum voltage rating below a voltage between the first node and the second node during the normal operation mode;
   a switching device; and
   a voltage limiter;
   wherein a combination of the voltage limiter and the switching device is configured to divide the voltage between the first node and the second node during the normal operation mode such that the voltage across the at least one clamping device is limited to a voltage below the maximum voltage rating, and wherein the switching device is configured, during the ESD mode, to drop, across the switching device, substantially all of a voltage between the first node and the second node in excess of a forward voltage drop across the at least one clamping device.

24. The ESD protection circuit of claim 23, wherein the at least one clamping device includes at least one metal oxide semiconductor (MOS) device, the switching device includes a silicon controlled rectifier (SCR), and the voltage limiter includes a resistor.

* * * * *